(12) United States Patent
Okamoto et al.

(10) Patent No.: US 10,693,457 B2
(45) Date of Patent: Jun. 23, 2020

(54) SEMICONDUCTOR INTEGRATED CIRCUIT DEVICE

(71) Applicant: SOCIONEXT INC., Kanagawa (JP)

(72) Inventors: Atsushi Okamoto, Yokohama (JP); Tomoyasu Kitaura, Yokohama (JP); Hirotaka Takeno, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 16/206,874

(22) Filed: Nov. 30, 2018

(65) Prior Publication Data

US 2019/0123741 A1    Apr. 25, 2019

Related U.S. Application Data

(63) Continuation of application No. PCT/JP2017/019019, filed on May 22, 2017.

(30) Foreign Application Priority Data

Jun. 1, 2016  (JP) .................. 2016-110402
Apr. 27, 2017  (JP) .................. 2017-088499

(51) Int. Cl.
  *H03K 17/60* (2006.01)
  *H03K 17/687* (2006.01)
  (Continued)

(52) U.S. Cl.
  CPC .......... *H03K 17/6871* (2013.01); *G06F 1/26* (2013.01); *H01L 27/0207* (2013.01);
  (Continued)

(58) Field of Classification Search
  CPC .......... H03K 17/6871; H03K 17/164; H03K 17/122; H03K 19/0016; G06F 1/26;
  (Continued)

(56) References Cited

U.S. PATENT DOCUMENTS

2006/0184808 A1*  8/2006  Chua-Eoan ........... G06F 1/3203
                                                    713/300
2010/0164598 A1   7/2010  Katou
                  (Continued)

FOREIGN PATENT DOCUMENTS

JP    2010-153535 A    7/2010
JP    2011-159810 A    8/2011
          (Continued)

OTHER PUBLICATIONS

International Search Report issued in International Patent Application No. PCT/JP2017/019019, dated Jun. 27, 2017.

*Primary Examiner* — Metasebia T Retebo
(74) *Attorney, Agent, or Firm* — McDermott Will & Emery LLP

(57) ABSTRACT

Power switch cells (20) respectively includes power switches (21), each of which is capable of performing switching between electrical connection and disconnection between a global power supply line (11) and a local power supply line (8) in accordance with a control signal (CTR). The power switches (21) are connected in a chain state to constitute a chain connection through which the control signal (CTR) is sequentially transmitted. A starting point switch (21a) in the chain connection has a greater distance to an edge (BE) of a region occupied by a power domain than an ending point switch (21b).

20 Claims, 13 Drawing Sheets

(51) Int. Cl.
  *H03K 17/16* (2006.01)
  *H03K 17/12* (2006.01)
  *H03K 19/00* (2006.01)
  *G06F 1/26* (2006.01)
  *H01L 27/118* (2006.01)
  *H01L 27/02* (2006.01)

(52) U.S. Cl.
  CPC ...... *H01L 27/11807* (2013.01); *H03K 17/122* (2013.01); *H03K 17/164* (2013.01); *H03K 19/0016* (2013.01); *H01L 2027/11881* (2013.01)

(58) Field of Classification Search
  CPC ........... H01L 27/11807; H01L 27/0207; H01L 2027/11881
  USPC ....................................................... 327/434
  See application file for complete search history.

(56) References Cited

U.S. PATENT DOCUMENTS

| | | | |
|---|---|---|---|
| 2012/0229190 A1 | 9/2012 | Kajihara et al. | |
| 2016/0036434 A1 | 2/2016 | Hara et al. | |
| 2017/0235352 A1* | 8/2017 | Kumar | G06F 1/266 |
| | | | 713/330 |

FOREIGN PATENT DOCUMENTS

| | | |
|---|---|---|
| JP | 2011-243794 A | 12/2011 |
| JP | 2012-190998 A | 10/2012 |
| JP | 2016-035995 A | 3/2016 |

\* cited by examiner

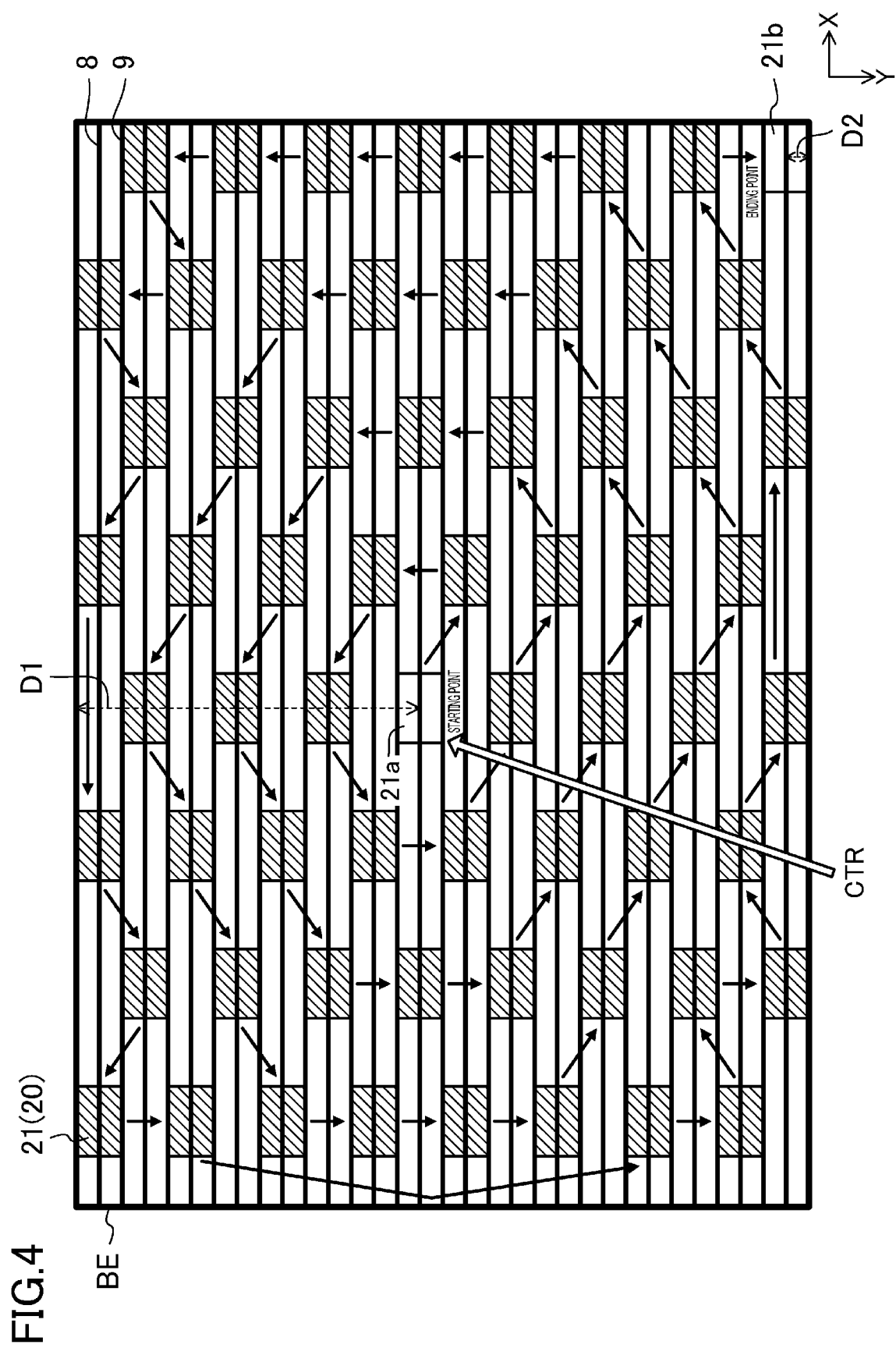

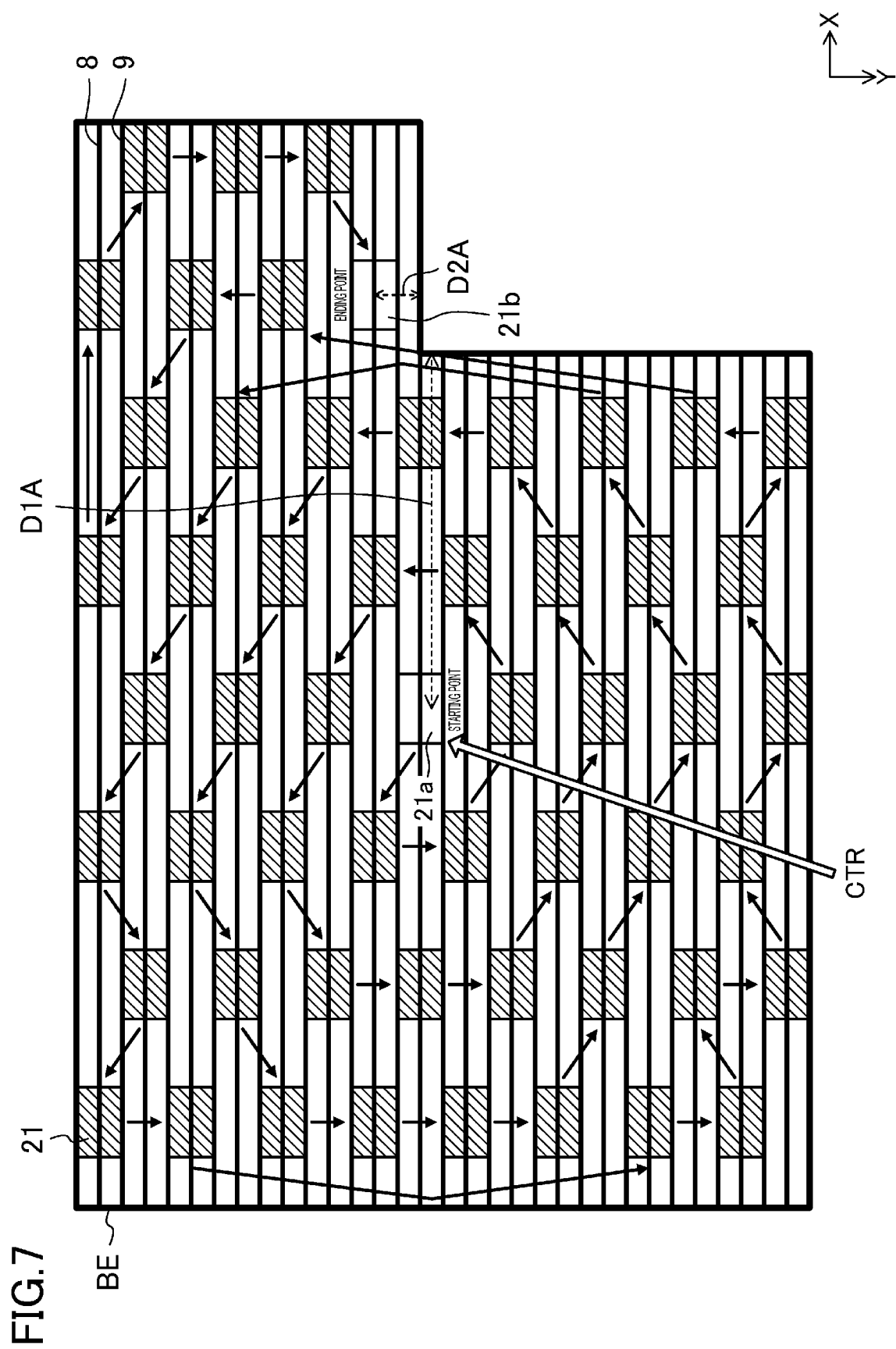

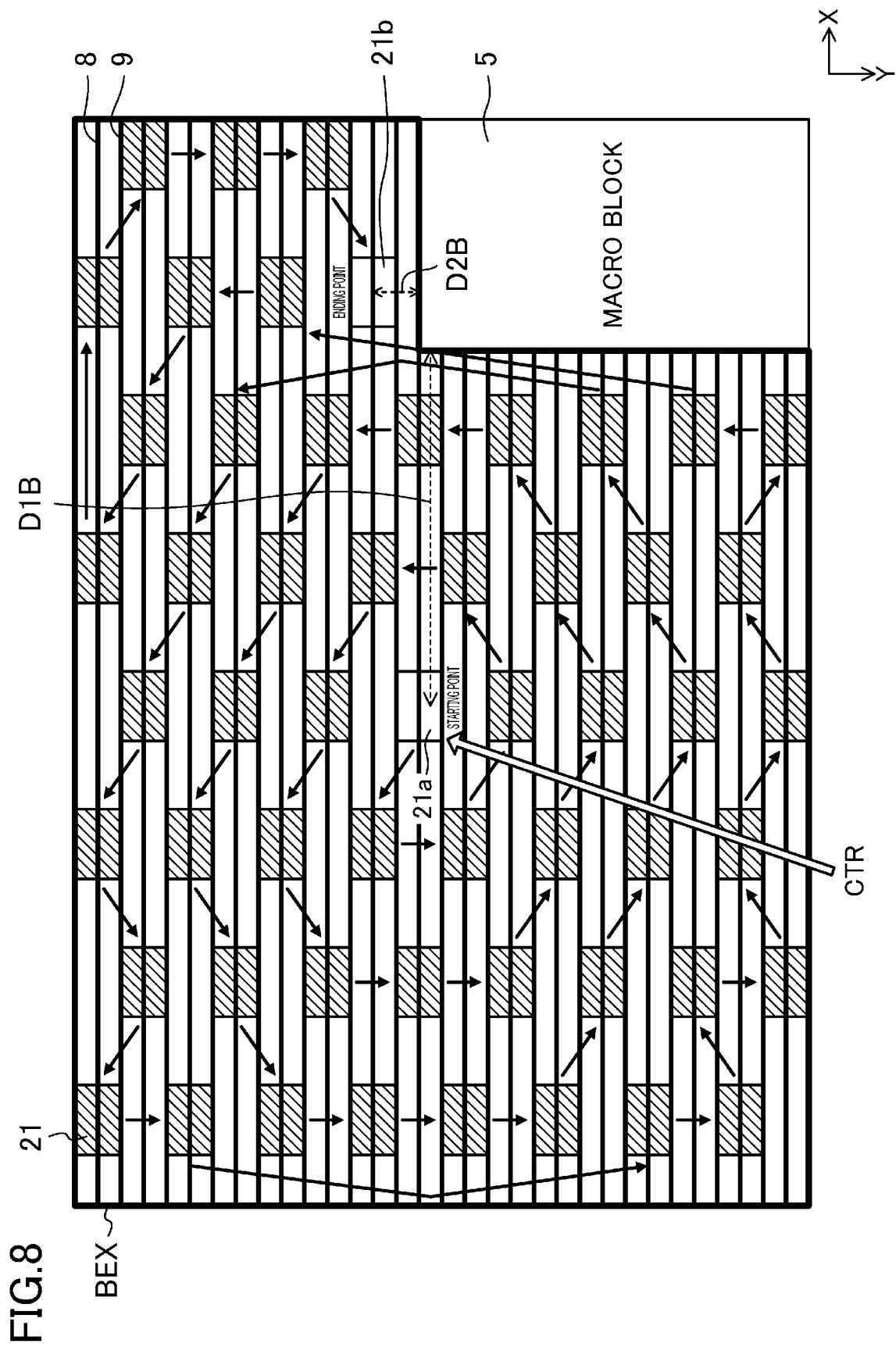

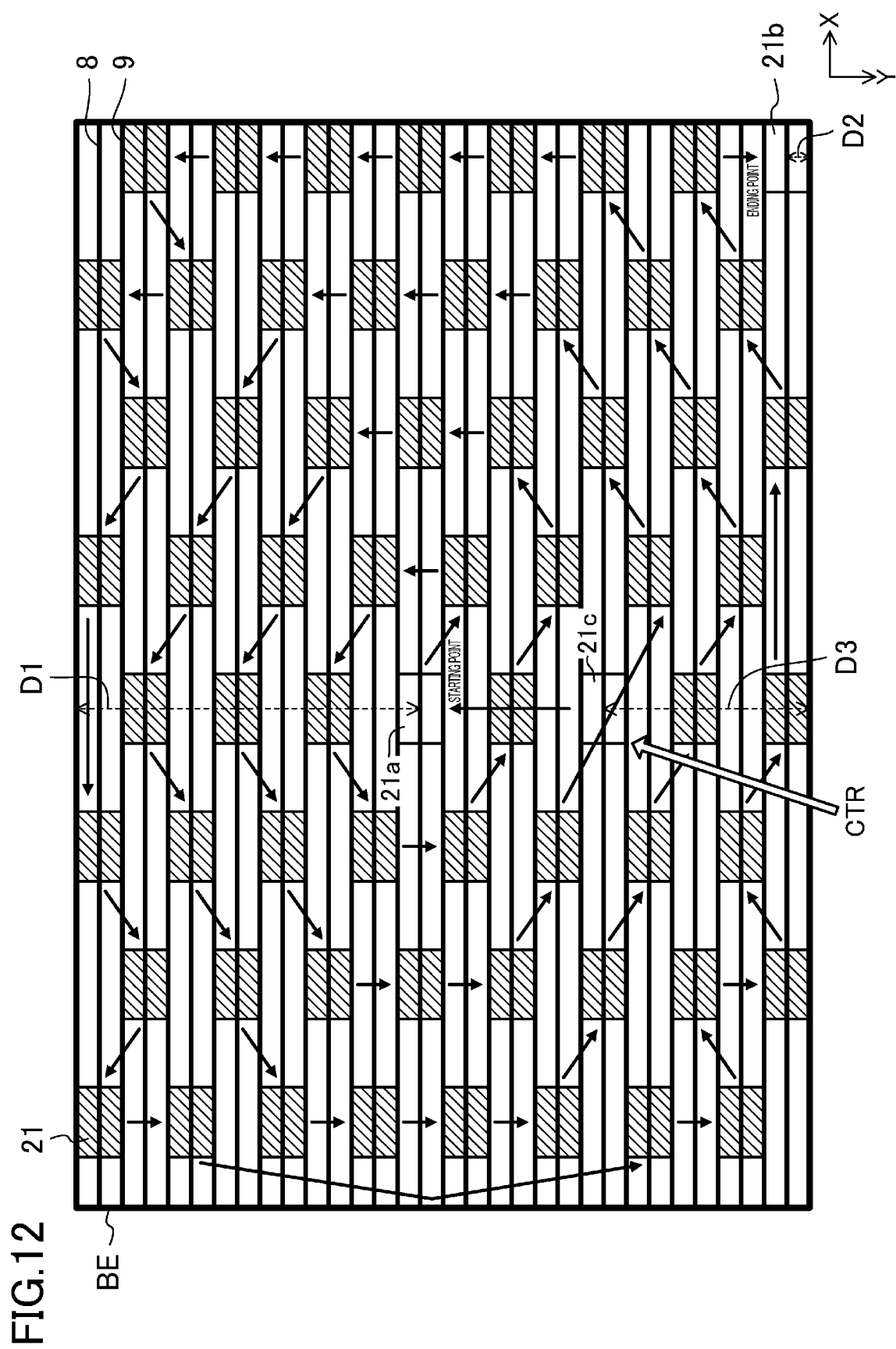

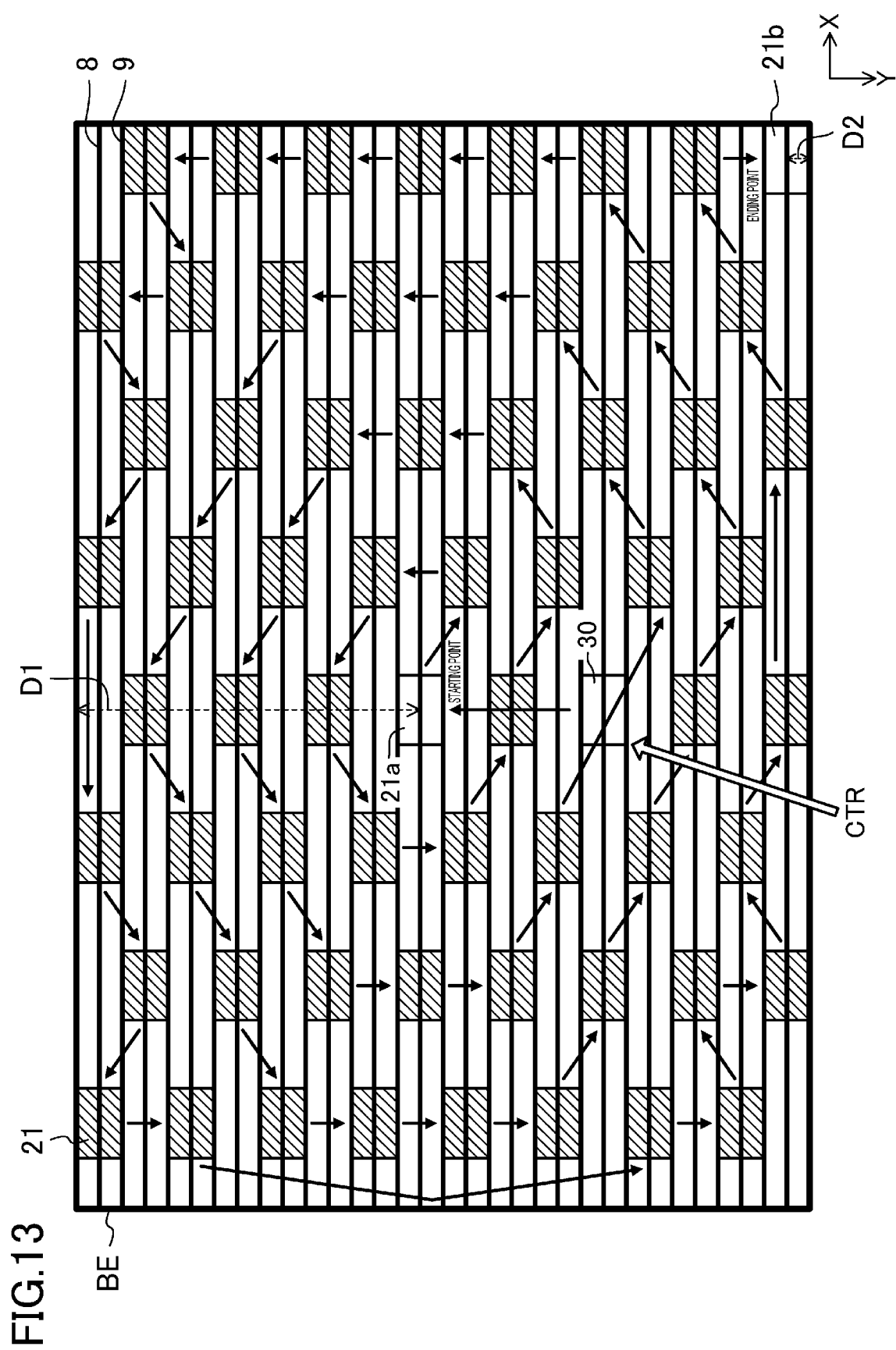

SEMICONDUCTOR INTEGRATED CIRCUIT DEVICE

CROSS-REFERENCE TO RELATED APPLICATIONS

This is a continuation of International Application No. PCT/JP2017/19019 filed on May 22, 2017, which claims priority to Japanese Patent Application No. 2016v-110402 filed on Jun. 1, 2016 and Japanese Patent Application No. 2017-088499 filed on Apr. 27, 2017. The entire disclosures of these applications are incorporated by reference herein.

BACKGROUND

The present disclosure relates to a technology for gating power supply in a semiconductor integrated circuit device.

Power gating is one of techniques for reducing power consumption of a semiconductor integrated circuit device. Through the power gating, internal circuitry of a semiconductor integrated circuit device is divided into a plurality of power domains (circuit blocks), and power supply to non-operating power domains is shut off, thereby reducing leakage current that leads to an increase of power consumption. The power gating uses a power switch that controls switching between electrical connection and disconnection between global power supply lines provided for the entire circuit arranged in a chip and local power supply lines provided for circuits of power domains.

Japanese Unexamined Patent Publication No. 2010-153535 discloses a configuration comprising multiple power switches, which are connected in a chain state. When power supply to a power domain to which power has been shut off is resumed, there occurs a problem of unstable operations of a semiconductor integrated circuit device due to lowered voltage of global power supply lines caused by an increase in current (rush current) flowing into the power domain. According to Japanese Unexamined Patent Publication No. 2010-153535, the rush current is reduced by sequentially turning on the power switches that are connected in the chain state.

SUMMARY

The configuration including multiple power switches connected in a chain state as disclosed by Japanese Unexamined Patent Publication No. 2010-153535 involves the following problem. Specifically, when power switches near edges of a power domain are sequentially turned on, a power supply voltage drop locally occurs in the surrounding of the power switches, which affects the surrounding power domains as noise.

An object of the present disclosure is to reduce, at the time of resuming power supply to a power domain to which power supply has been shut off, rush current flowing into the power domain, and avoid the influence on the surrounding power domains in a semiconductor integrated circuit device using a power gating technique.

According to an aspect of the present disclosure, a semiconductor integrated circuit device includes: a global power supply line; and a power domain, the power domain including: a local power supply line; a plurality of standard cells connected to the local power supply line; and a plurality of power switch cells. Each of the plurality of power switch cells includes a power switch capable of performing switching between electrical connection and disconnection between the global power supply line and the local power supply line in accordance with a control signal, the power switches are connected in a chain state to form a chain connection through which the control signal is sequentially transmitted, the power switches including a starting point switch which is positioned at the beginning of the chain connection and to which the control signal is given from outside of the power domain, and at least one ending point switch positioned at the end of the chain connection, and the starting point switch has a greater distance to an edge of a region occupied by the power domain than the at least one ending point switch.

According to this aspect, in the power domain, the power switches each of which is capable of performing switching between electrical connection and disconnection between the global power supply line and the local power supply line are connected in the chain state to form a chain connection through which the control signal is sequentially transmitted. Furthermore, the starting point switch which is positioned at the beginning of the chain connection and to which the control signal is given from the outside of the power domain has a greater distance to the edge of the region occupied by the power domain than the ending point switch which is positioned at the end of the chain connection. Thus, when the starting point switch is turned on, a power voltage drop that locally occurs in the surrounding thereof has little effect on power domains surrounding the power domain. Accordingly, at the time of resuming power supply to the power domain, rush current flowing into the power domain can be reduced and the influence on the surrounding power domains can be avoided.

According to another aspect of the present disclosure, a semiconductor integrated circuit device includes: a global power supply line; and a power domain, the power domain including: a local power supply line; a plurality of standard cells connected to the local power supply line; and a plurality of power switch cells. Each of the plurality of power switch cells includes a power switch capable of performing switching between electrical connection and disconnection between the global power supply line and the local power supply line in accordance with a control signal, the power switches are configured such that the control signal electrically and sequentially connects the global power supply line and the local power supply line, the power switches including a starting point switch which firstly establishes electrical connection between the global power supply line and the local power supply line, and at least one ending point switch which lastly establishes electrical connection between the global power supply line and the local power supply line, and the starting point switch has a greater distance to an edge of a region occupied by the power domain than the at least one ending point switch.

According to this aspect, in the power domain, the power switches, each of which is capable of performing switching between electrical connection and disconnection between the global power supply line and the local power supply line, are configured such that the control signal electrically and sequentially connects the global power supply line and the local power supply line. Furthermore, the starting point switch which firstly establishes electrical connection between the global power supply line and the local power supply line has a greater distance to the edge of the region occupied by the power domain than the ending point switch which lastly establishes electrical connection between the global power supply line and the local power supply line. Thus, when the starting point switch is turned on, a power supply voltage drop that locally occurs in the surrounding thereof has little effect on the power domains surrounding the power domain. Accordingly, at the time of resuming power supply to the power domain, rush current flowing into the power domain can be reduced and the influence on the surrounding power domains can be avoided.

According to the present disclosure, at the time of resuming power supply to a power domain to which power supply has been shut off, rush current flowing into the power domain can be reduced and the influence on surrounding power domains can be avoided in a semiconductor integrated circuit device using a power gating technique.

BRIEF DESCRIPTION OF THE DRAWINGS

FIG. 4 shows a chain connection of power switches according to a first embodiment.

FIG. 7 shows a configuration of a chain connection of power switches in an alternative example of the first embodiment.

FIG. 8 shows a configuration of a chain connection of power switches according to a second embodiment.

FIG. 12 is a view corresponding to FIG. 11A, illustrating a configuration of a chain connection of power switches.

FIG. 13 is a view corresponding to FIG. 11B, illustrating a configuration of a chain connection of power switches.

DETAILED DESCRIPTION

Embodiments will be described below with reference to the accompanying drawings.

First Embodiment

Figure 1:
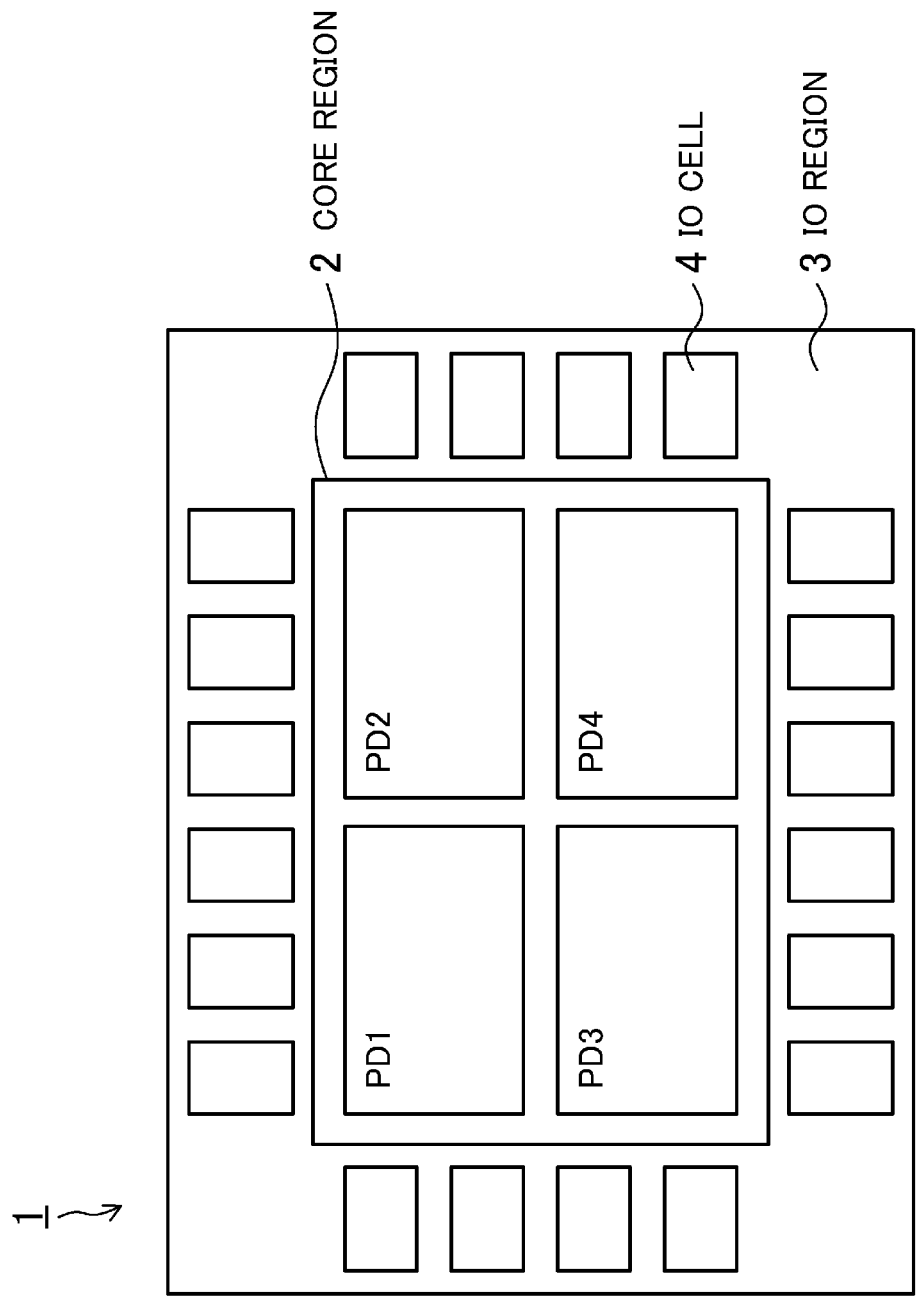
FIG. 1 is a plan view schematically illustrating an overall configuration of a semiconductor integrated circuit device according to an embodiment.

FIG. 1 is a plan view schematically illustrating an overall configuration of a semiconductor integrated circuit device according to an embodiment. A semiconductor integrated circuit device 1 illustrated in FIG. 1 comprises a core region 2 in which an internal circuit is formed, and an IO region 3 surrounding the core region 2 and including an interface circuit (10 circuit). Global power supply lines (not illustrated) for supplying a power supply potential and a ground potential to the core region 2 are provided throughout the core region 2. The global power supply lines are configured in the shape of a mesh, for example. In addition, although an illustration is simplified in FIG. 1, a plurality of IO cells 4 constituting the interface circuit are arranged in the IO region 3 to surround the core region 2.

In FIG. 1, power domains PD1 to PD4 are arranged in the core region 2. The power domains PD1 to PD4 are respectively provided with local power supply lines (not illustrated) for the supply of a power supply potential and a ground potential. Each of the power domains PD1 to PD4 includes multiple power switches that are capable of switching between electrical connection and disconnection between the global power supply lines and the local power supply lines in accordance with a control signal. The control signal is sent from, for example, a control block that controls power gating. Through switching the multiple power switches in accordance with the control signal, power supply and shut-off can be controlled for each of the power domains PD1 to PD4. In the present embodiment, the power switches are provided between the global power supply lines for supplying a power supply potential and the local power supply lines for supplying a power supply potential. It should be noted that the power switches may be provided between the global power supply lines for supplying a ground potential and the local power supply lines for supplying a ground potential.

Figure 2:
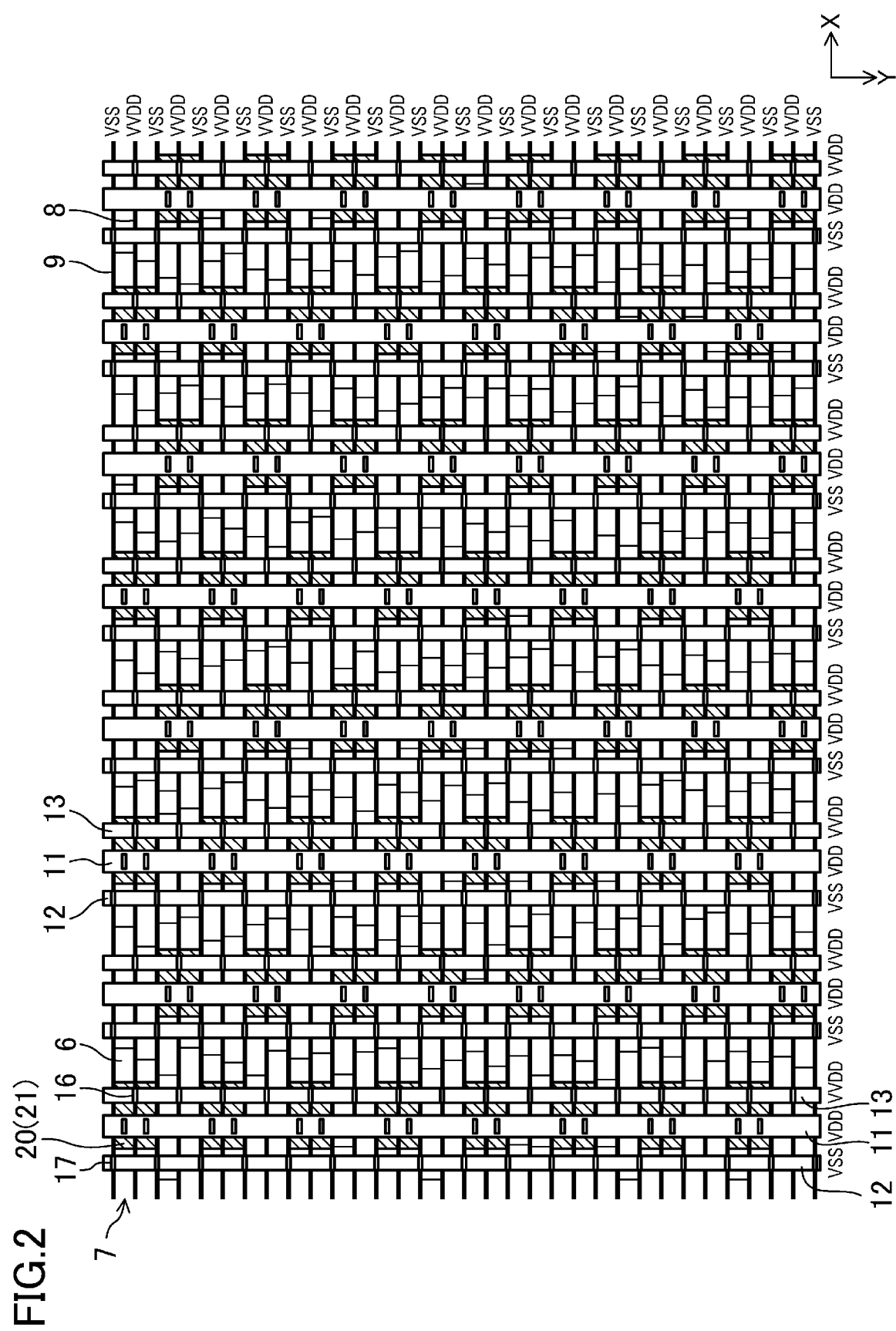
FIG. 2 is a plan view illustrating a layout of power domains according to an embodiment.

FIG. 2 is an enlarged view of any one of the power domains PD1 to PD4 in the semiconductor integrated circuit device of FIG. 1. FIG. 2 is a simplified illustration of a layout of the power domains. In FIG. 2, a plurality of standard cells 6 are arranged in an X-direction (a horizontal direction of the drawing), and a plurality of standard cell rows 7 comprising the plurality of standard cells 6 are arranged in a Y-direction (a vertical direction of the drawing). Each standard cell 6 is a basic circuit element which functions as, for example, an inverter or a logic circuit. A circuit block which achieves desired functions can be designed and manufactured by arranging and combining the standard cells 6 via wiring. Each standard cell 6 has an N-type region in which a P-type metal oxide semiconductor (MOS) transistor (PMOS) is formed, and a P-type region in which an N-type MOS transistor (NMOS) is formed. In the present disclosure, the standard cell 6 has N- and P-type regions arranged side by side in the Y-direction. The arrangement of the N- and P-type regions is reversed between two adjacent standard cell rows 7. The internal structure of the standard cell 6 is not shown in the drawings.

Local power supply lines 8 (with an indication "VVDD" on the right), each of which supplies a power supply potential to the standard cells 6, and local power supply lines 9 (with an indication VSS on the right), each of which supplies a ground potential to the standard cells 6, are alternately arranged in the vertical direction with a single standard cell row 7 interposed between them. The local power supply lines 8 and the local power supply lines 9 extend in the X-direction. Each local power supply line 8 feeds a power supply potential to the standard cell rows 7 on both sides thereof in the Y-direction. Each local power supply line 9 feeds a ground potential to the standard cell rows 7 on both sides thereof in the Y-direction.

Global power supply lines 11 (with an indication "VDD" below) for supplying a power supply potential, and global power supply lines 12 (with an indication "VSS" below) for supplying a ground potential extend in the Y-direction in a layer above the standard cell rows 7, the local power supply lines 8, and the local power supply lines 9. In addition, local power supply lines 13 (with an indication "VVDD" below) extending in the Y-direction are provided in a layer above the standard cell rows 7, the local power supply lines 8, and the local power supply lines 9. The local power supply line 13 is provided to enhance the power supply, and is connected to the local power supply lines 8 passing under the local power supply line 13 through via structures 16. In addition, the global power supply line 12 is connected to the local power supply lines 9 passing under the global power supply line 12 through via structures 17.

Furthermore, a power switch cell 20 (hatched in the drawing) is provided for each of the local power supply lines 8. The power switch cell 20 controls power supply/shut-off to the standard cells 6, and it has a power switch 21 capable of performing switching between electrical connection and disconnection between the local power supply line 8 and the global power supply line 11 in accordance with a control signal. In this example, the power switch cell 20 is a double-height cell. The power switch cell 20 is provided at an intersection of the global power supply line 11 and the local power supply line 8 when viewed in plan. Note that the power switch cells 20 are not arranged at some of the intersections of the global power supply lines 11 and the local power supply lines 8.

In FIG. 2, "VDD" indicates lines from the power supply to the power switch cell 20, i.e., the global power supply lines 11, and "VVDD" indicates lines that go beyond the power switch cell 20, i.e., the local power supply lines 8 and 13. Note that when the power switch 21 is in conduction, the same power supply potential is supplied through both of the power supply lines "VDD" and "VVDD."

In the configuration shown in FIG. 2, the global power supply lines 11 overlap with the power switch cells 20 when viewed in plan. However, this configuration is not limiting. If the switch cells 20 are arranged below the power supply straps 11, a value of resistance of a path between the input terminal 21 of each switch cell 20 and the power supply strap 11, such as wiring and via structures, decreases. This can reduce drop of the power supply voltage.

In addition, in the configuration of FIG. 2, each of the local power supply lines 13 is arranged next to an associated one of the global power supply lines 11. However, this configuration is not limiting. For example, the local power supply line 13 may be arranged with a gap from the global power supply line 11 so as not to overlap with the power switch cell 20 when viewed in plan. Alternatively, the local power supply lines 13 may not be arranged next to some of the global power supply lines 11. Moreover, in the configuration of FIG. 2, the local power supply line 13 is electrically connected to all the local power supply lines 8 passing under the local power supply line 13. However, this configuration is not limiting. For example, the local power supply line 13 may be connected to only some of the local power supply lines 8 passing under the local power supply line 13.

Figure 3A:
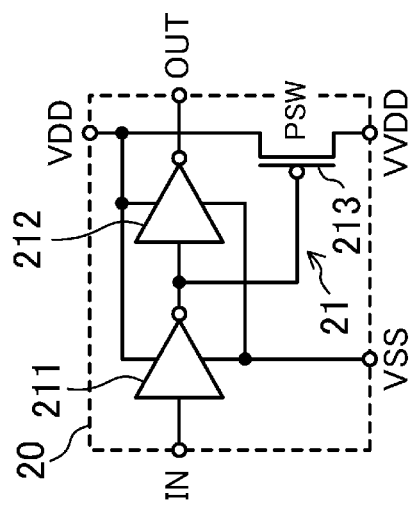
FIG. 3A shows a circuit configuration example of a power switch cell.
Figure 3B:
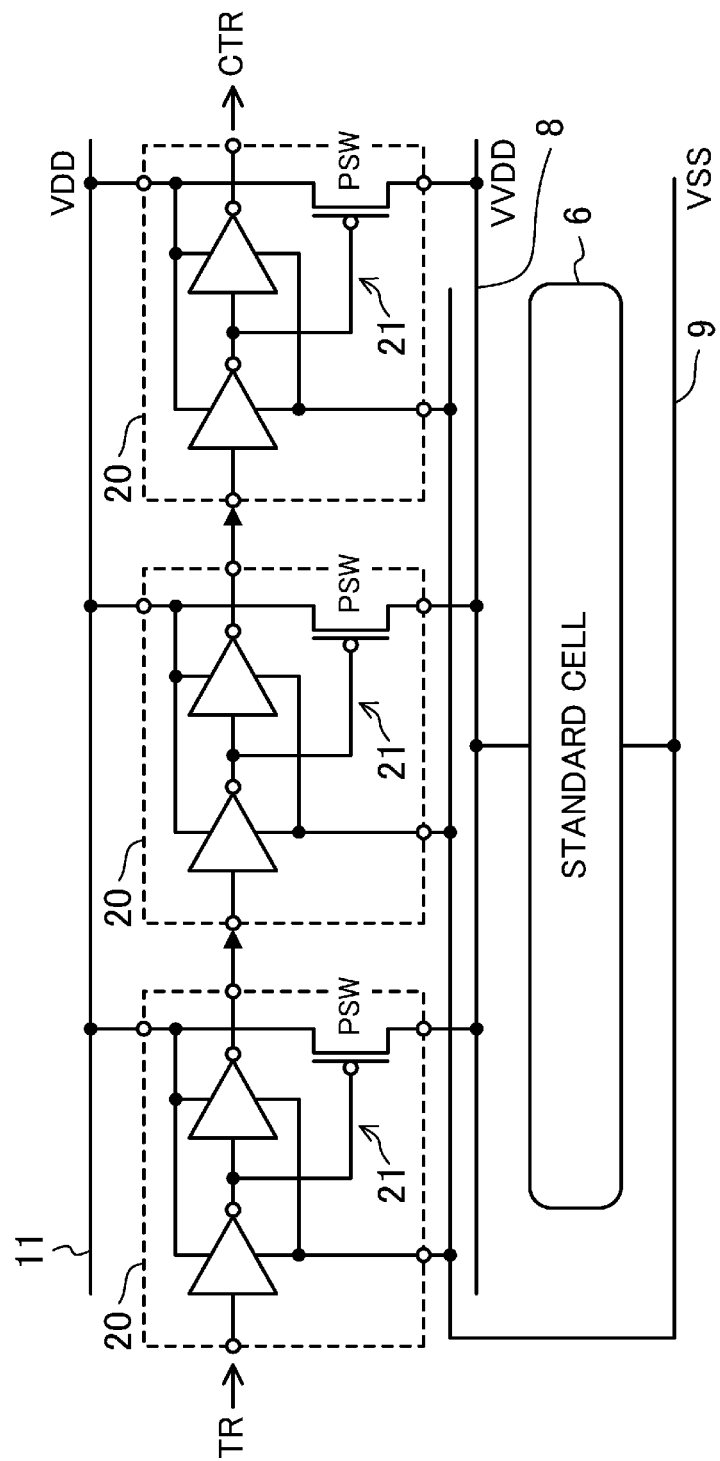
FIG. 3B shows a connection state of the power switch cells of FIG. 3A.

FIG. 3A is a circuit configuration example of the power switch cell 20, and FIG. 3B illustrates a connection state of the power switch cells 20. As illustrated in FIG. 3A, the power switch cell 20 contains one power switch 21, and the power switch 21 has inverters 211 and 212 connected in series, and a P-type transistor 213. A control signal CTR is given to a node IN, and is output from a node OUT through the inverters 211 and 212. In the P-type transistor 213, a gate is connected to an intermediate node between the inverters 211 and 212, a source is connected to a node VDD, and a drain is connected to a node VVDD. When the control signal CTR is at a high level, the potential of the intermediate node between the inverters 211 and 212 is at a low level, which turns the P-type transistor 213 on (conduction state). On the other hand, when the control signal CTR is at a low level, the potential of the intermediate node between the inverters 211 and 212 is at a high level, which turns the P-type transistor 213 off (non-conduction state). More specifically, the power switch 21 can perform switching between conduction and cut-off between the node VDD and the node VVDD in accordance with the control signal CTR.

As illustrated in FIG. 3B, the power switch cell 20 has the node VDD connected to the global power supply line 11, and the node VVDD connected to the local power supply line 8. Accordingly, the power switch 21 is capable of performing switching between electrical connection and disconnection between the global power supply line 11 and the local power supply line 8 in accordance with the control signal CTR. In addition, the power switches 21 are connected in a chain state so as to sequentially transmit the control signal CTR. In the present disclosure, a configuration in which multiple power switches are connected in a chain state so as to sequentially transmit a control signal will be referred to as the "chain connection."

FIG. 4 is a plan view illustrating an example of the chain connection of the power switches 21 in the present embodiment. In FIG. 4, the global power supply lines 11, the global power supply lines 12, and the local power supply lines 13 are omitted from the layout of the power domains in FIG. 2, and illustrations of the standard cells 6 are also omitted. In FIG. 4, an arrow heading from the power switch 21 toward another power switch 21 indicates transmission of the control signal CTR. It should be noted that, actually, the transmission of the control signal CTR is realized via a signal line extending in the X- or Y-direction. Further, BE indicates the domain edges, i.e., the edges of a region occupied by the power domain.

In the chain connection of FIG. 4, the control signal CTR given from the outside of the power domain is firstly given to a power switch 21a that is positioned approximately at the center of the power domain. Then, the control signal CTR is transmitted from the center toward the peripheral part of the power domain by sequentially going through the power switches 21 in a spiral fashion. The control signal CTR is finally transmitted to a power switch 21b at the bottom right of the figure. In other words, the chain connection of FIG. 4 includes a structure in which the multiple power switches 21 sequentially transmitting the control signal CTR are arranged in a spiral fashion.

Here, we define a distance from the power switch 21 to the closest one of sides of the power domain included in the domain edge BE as a "distance to the domain edge BE." Then, attention is paid to the power switch 21a (starting point switch) positioned at the beginning of the chain connection and the power switch 21b (ending point switch) positioned at the end of the chain connection. Among the domain edge BE, the top side in the drawing is the closest to the starting point switch 21a. Thus, a distance D1 in FIG. 4 is the distance to the domain edge BE. On the other hand, since the bottom side in the drawing is the closest to the ending point switch 21b, a distance D2 is the distance to the domain edge BE. As is clear from FIG. 4, the following formula is met.

$$D1 > D2$$

Specifically, the starting point switch 21a has a greater distance to the domain edge BE than the ending point switch 21b.

According to the configuration as illustrated in FIG. 4, the influence of a power supply voltage drop on the surrounding of a power domain to which power supply is to be resumed can be reduced. More specifically, when the power supply to a power domain that has been in a power shut-off state is resumed, the starting point switch 21a positioned at the central part of the power domain is first turned on. At this time, current that has been interrupted is rapidly supplied to the power domain, which generates large current, and causes a power supply voltage drop in the global power supply lines 11. However, since the starting point switch 21a has a great distance to the domain edge BE, the power supply voltage drop in the global power supply lines 11 give little influence on other power domains. Then, the power switches 21 are sequentially turned on from the surrounding of the starting point switch 21a, and the ending point switch 21b positioned at the peripheral part is finally turned on. At that time, the large current generated at the beginning of the resuming of the power supply is settled, and thus, other power domains are hardly affected.

In addition, the length of a signal line transmitting the control signal CTR can be shortened because the power switches 21 are connected in a spiral fashion from the central part toward the peripheral part. Thus, the influence of the power voltage drop on the surrounding of the power domain can be reduced without increasing the wiring area. In addition, when the power switch 21 is turned on, ramp up of the power supply voltage of the local power supply line 8 to which this power switch 21 is connected can be expected. Thus, by sequentially turning on the power switch 21 in the vicinity of the power switch 21 that was turned on, a voltage difference between the global power supply lines 11 and the local power supply lines 8 when turning on the power switch 21 becomes small. In this manner, noise due to a power supply voltage fluctuation can be further reduced.

In the configuration of FIG. 4, the power switches 21 are connected in a spiral fashion throughout the chain connection. However, this configuration is not limiting. For example, a configuration in which the power switches 21 are connected in a spiral fashion in a portion of the chain connection may be employed.

Figure 5A:
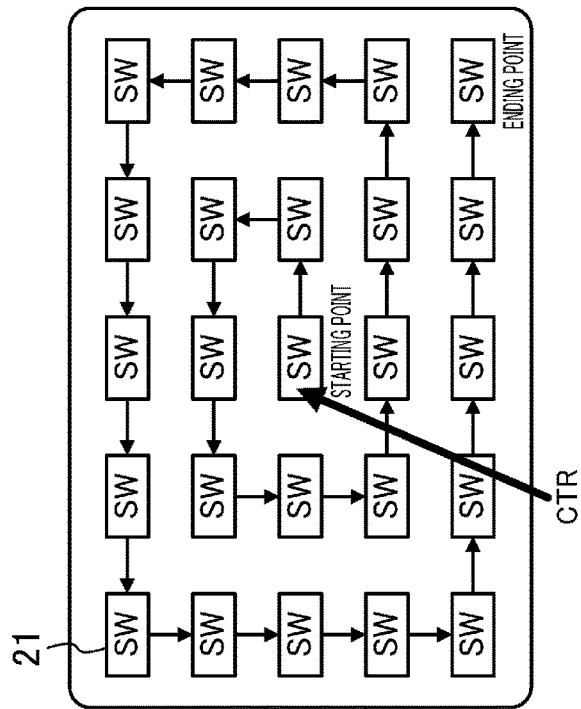
FIGS. 5A to 5C are conceptual diagrams illustrating examples of a chain connection of power switches.
Figure 5B:
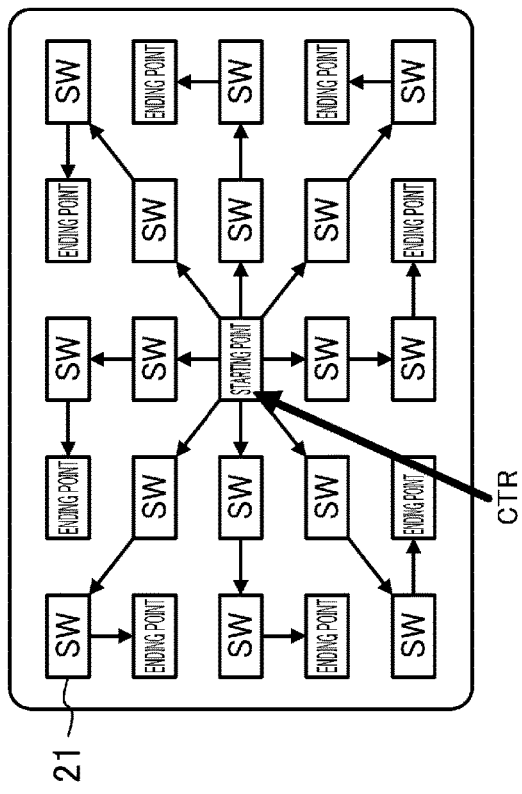

FIGS. 5A and 5B are conceptual diagrams illustrating an example of the chain connection of the power switches. FIG. 5A shows the power switches 21 connected in a spiral fashion, and corresponds to the configuration illustrated in FIG. 4, although the number of the power switches 21 is different.

FIG. 5B shows the power switches 21 that are radially connected. The control signal CTR is branched and transmitted from the power switch 21 that functions as the starting point to multiple (eight in FIG. 5B) power switches 21 around the starting power switch 21, and the control signal CTR is further transmitted toward the surrounding of the power domain. There are multiple (eight in FIG. 5B) power switches 21 that serves as ending points. Note that the starting power switch 21 has a greater distance from the domain edge than any of the power switches 21 serving as the ending points.

Figure 5C:
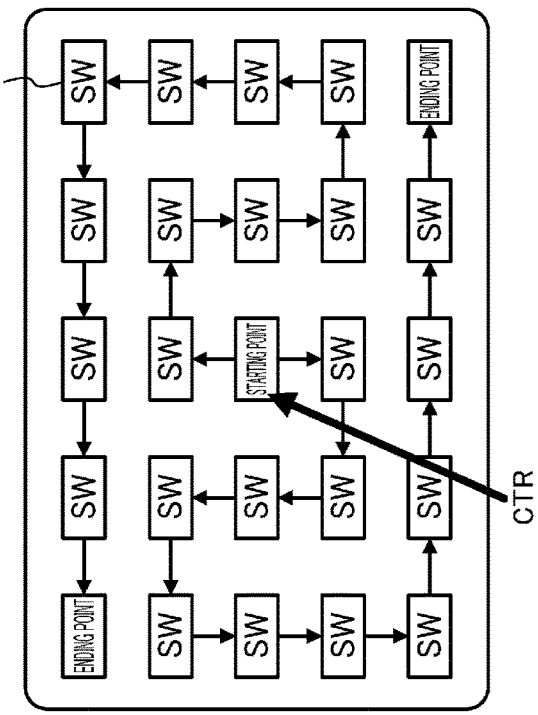

FIG. 5C shows the power switches 21 branched and connected in two routes. The control signal CTR is branched and transmitted from the power switch 21 serving as the starting point to two power switches 21 above and below it, and the control signal CTR is further transmitted toward the surrounding of the power domain. Two power switches 21 serve as the ending points. Note that the power switch 21 as the starting point has a greater distance from the domain edge than any of the power switches 21 serving as the ending points.

As illustrated in FIG. 5B and FIG. 5C, the chain connection of the power switches may include a branch structure in which the control signal CTR is branched and transmitted from one power switch 21 to multiple power switches 21. With the branch structure, time required for transmitting the control signal CTR to the entire power domain can be shortened. In FIG. 5B and FIG. 5C, the control signal CTR is branched from the power switch 21 serving as the starting point. However, this is not limiting. The control signal CTR may be branched from the power switch 21 that is in the midpoint of the chain connection. More specifically, the "chain connection" in the present disclosure may include a branch structure in which a control signal is branched and transmitted from one power switch to multiple power switches.

Figure 6:
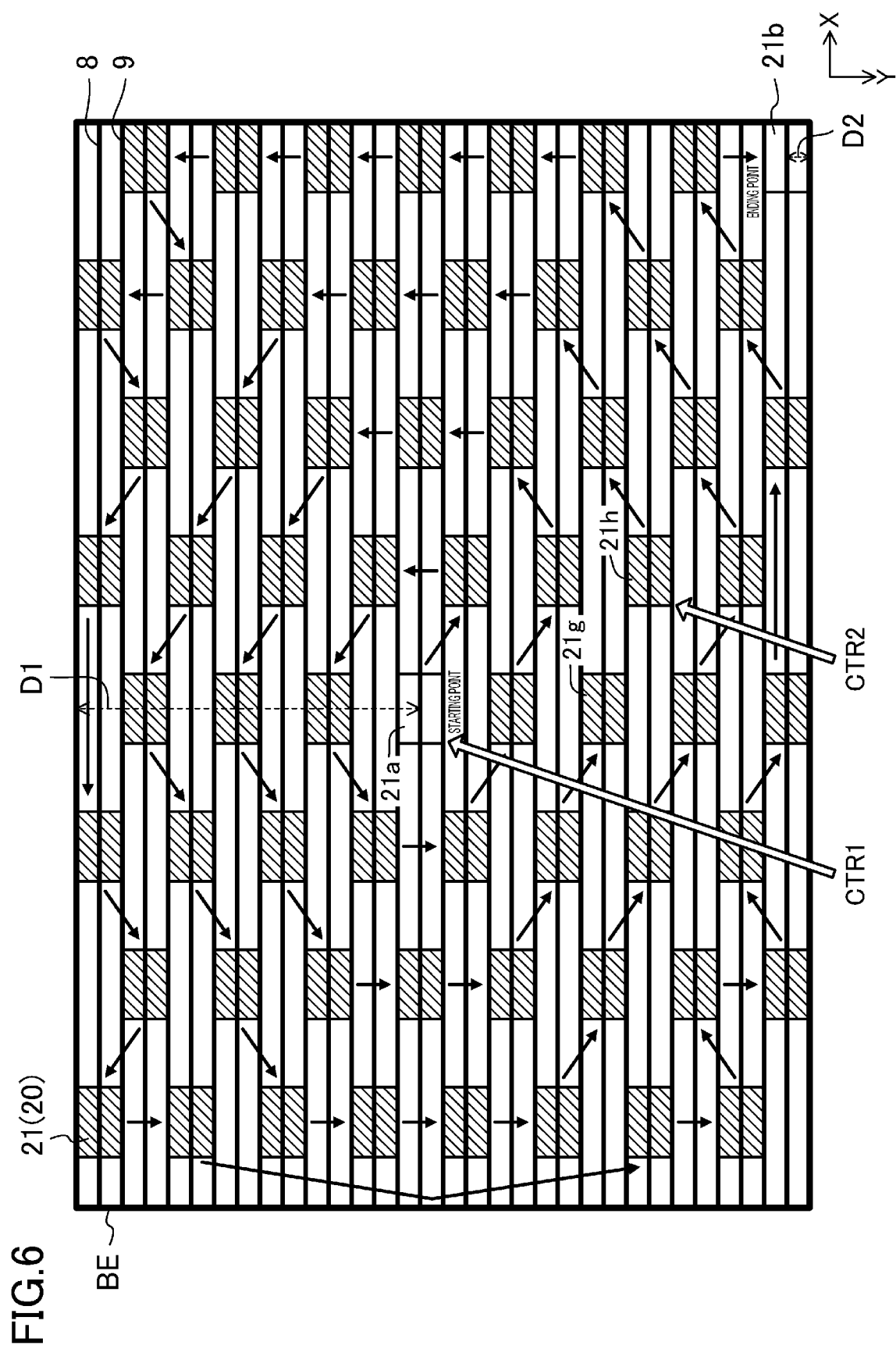
FIG. 6 shows another configuration example of a chain connection of power switches according to the first embodiment.

FIG. 6 shows another configuration example of the chain connection of the power switches according to the present embodiment. In the example of FIG. 6, the chain connection of the power switches 21 is divided into two portions, that is, a portion from the power switch 21a which receives a control signal CTR1 to a power switch 21g (first chain), and a portion from a power switch 21h which receives a control signal CTR2 to the power switch 21b (second chain).

Firstly, the control signal CTR1 is given from the outside of a power domain, and the control signal CTR1 is sequentially transmitted from the power switch 21a through the first chain to be transmitted to the power switch 21g. Then, the control signal CTR2 is given from the outside of the power domain, and the control signal CTR2 is sequentially transmitted from the power switch 21h through the second chain to be transmitted to the power switch 21b. More specifically, in FIG. 6, the power switch 21 is configured such that the control signals CTR1, CTR2 electrically and sequentially connect the global power supply lines 11 and the local power supply lines 8. Furthermore, the power switch 21a corresponds to the starting point switch which firstly establishes electrical connection between the global power supply line 11 and the local power supply line 8, and the power switch 21b corresponds to the ending point switch which lastly establishes electrical connection between the global power supply line 11 and the local power supply line 8. The starting point switch 21a has a greater distance to the domain edge BE than the ending point switch 21b.

The same advantage as obtained in the configuration of FIG. 4 can also be obtained in this configuration. Further, a delay time is provided between a point at which the control signal CTR1 is transmitted to the power switch 21g, which is the last power switch in the first chain, and a point at which the control signal CTR2 is given to the power domain. Thus, a power voltage of the local power supply line 8 can be raised before the power switch 21 of the second chain is turned on. This can further reduce the generation of rush current.

As can be seen, in the present disclosure, the chain connection of the power switches 21 may be divided into a plurality of portions.

ALTERNATIVE EXAMPLE

In the above-described embodiment, it has been described that the power domain has a rectangle shape, but the power domain may have a shape other than the rectangle. Also in this case, the same advantages as those obtained in the above-described embodiment can also be obtained.

FIG. 7 is a plan view illustrating another example of the chain connection of the power switches 21 of the present embodiment. In FIG. 7, just like in FIG. 4, the global power supply lines, the local power supply lines, and the standard cells are omitted. An arrow heading from one power switch 21 to another power switch 21 indicates transmission of the control signal CTR. BE indicates the domain edges, i.e., the edges of a region occupied by the power domain.

The chain connection in FIG. 7 includes a structure in which multiple power switches 21 sequentially transmitting the control signal CTR are arranged in a spiral fashion. In the example of FIG. 7, the power domain is not in the rectangular shape, but has a shape obtained by partially cutting a rectangle. Among the domain edges BE shown in FIG. 7, an edge corresponding to a vertically extending side of the cut-off part at the bottom right of the drawing is the closest to the starting point switch 21a. Thus, a distance D1A in FIG. 7 is the distance to the domain edge BE. On the other hand, since an edge corresponding to the top side of the cut-off part at the bottom right of the drawing is the closest to the ending point switch 21b, a distance D2A in FIG. 7 is the distance to the domain edge BE. As is clear from FIG. 7, the following formula is met.

$$D1A > D2A$$

Also in the configuration of FIG. 7, the influence of a power supply voltage drop on the surrounding of a power domain to which power supply is to be resumed can be reduced.

Second Embodiment

In a second embodiment, the power domain includes a macro block in a region thereof. More specifically, the entire power domain including the standard cell region and the macro block is capable of performing switching between electrical connection and disconnection between the local power supply lines and the global power supply lines in accordance with a control signal. The macro block is, for example, a memory block such as SRAM.

FIG. 8 is a plan view illustrating an example of the chain connection of the power switches 21 according to the second embodiment. The power domain illustrated in FIG. 8 includes a macro block 5 within a region thereof. In FIG. 8, the global power supply lines, the local power supply lines, and the standard cells are not shown. An arrow heading from one power switch 21 to another power switch 21 indicates transmission of the control signal CTR.

In general, power supply lines are often plentifully laid in the macro block in order to avoid a power supply voltage drop, and the impedance of the power supply lines is low. Thus, if a power switch that is arranged in the vicinity of the macro block is turned on, the surrounding of the power domain may be significantly affected through low-impedance power supply lines of the macro block, even if the power switch is distant from the edges of the power domain. Accordingly, in a case where the power domain includes the macro block, the power switches are preferably arranged in consideration of a region occupied by the macro block.

Accordingly, in the present embodiment, the power switches are arranged while paying attention to, not the edges of the region of the power domain, but the edges of a region of the power domain excluding the macro block. In FIG. 8, BEX indicates the edges of a region (region edges) in which the macro block 5 is excluded from the region occupied by the power domain. More specifically, in the present embodiment, when the power domain includes the macro block 5, a region of the power domain excluding the macro block 5 is regarded as the region occupied by the power domain.

The chain connection of FIG. 8 includes a structure in which multiple power switches 21 sequentially transmitting the control signal CTR are arranged in a spiral fashion. In the example of FIG. 8, among the region edges BEX, an edge corresponding to a vertically extending side of the macro block 5 is the closest to the starting point switch 21a. Thus, a distance D1B of FIG. 8 is the distance to the region edge BEX. On the other hand, since an edge corresponding to an upper side of the macro block 5 is the closest to the ending point switch 21b, a distance D2B of FIG. 8 is the distance to the region edge BEX. As is clear from FIG. 8, the following formula is met.

$$D1B > D2B$$

If the power domain includes a macro block, the configuration of FIG. 8 can reduce the influence of the power supply voltage drop on the surrounding of the power domain, the power supply to which is to be resumed.

Third Embodiment

In the first embodiment, it has been described that the power switch cell 20 includes one power switch 21. In the present embodiment, the power switch cell includes two switches having different driving capabilities.

Figure 9A:
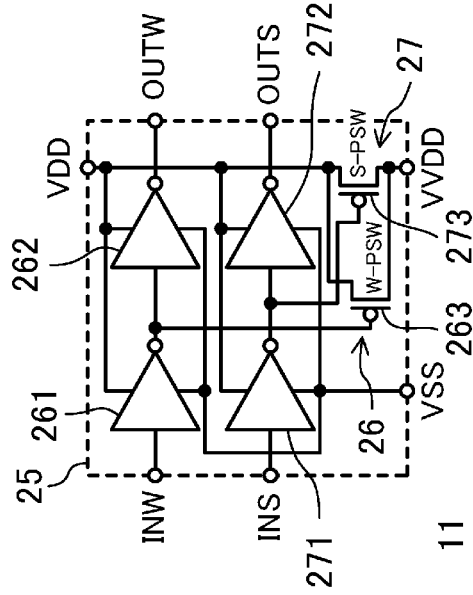
FIG. 9A shows a circuit configuration example of a power switch cell.
Figure 9B:
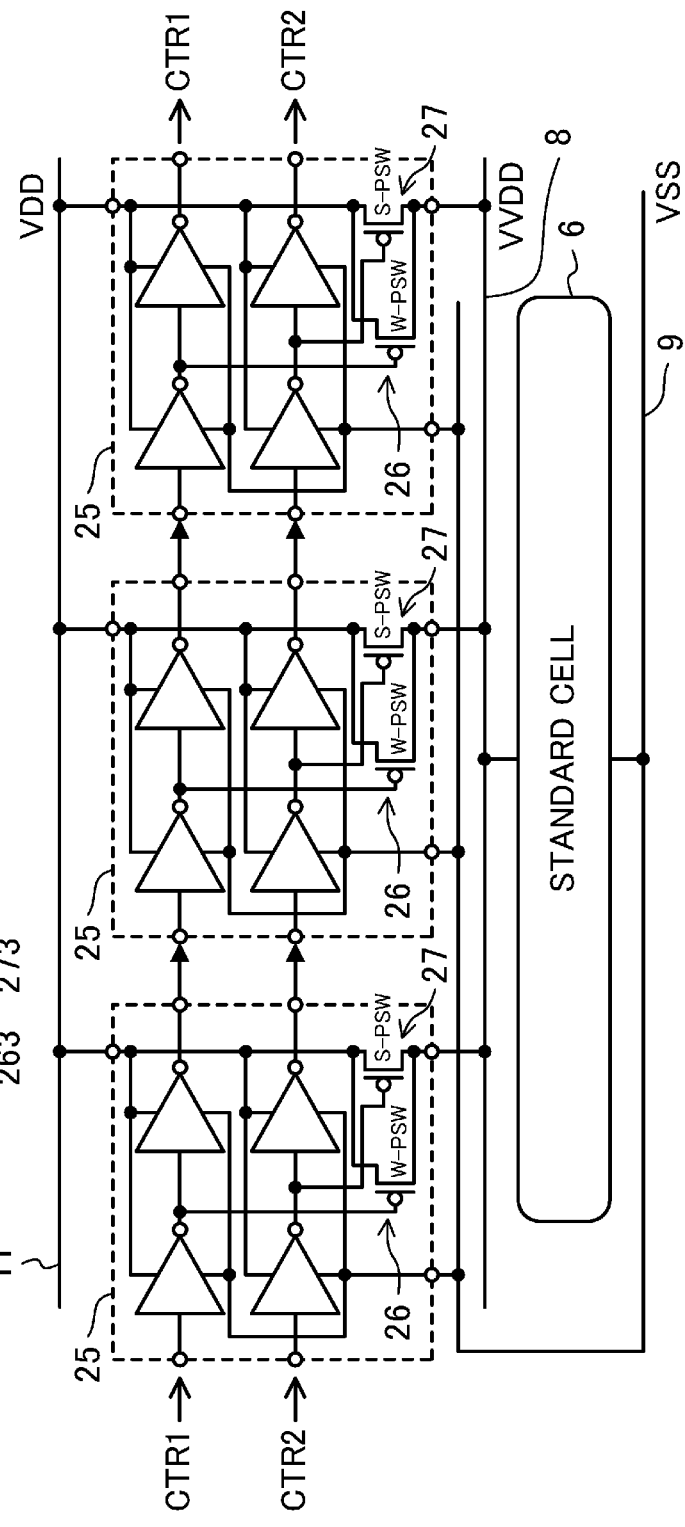
FIG. 9B is a connection state of the power switch cells of FIG. 9A.

FIG. 9A is a circuit configuration example of a power switch cell 25, and FIG. 9B illustrates a connection state of the power switch cells 25. As illustrated in FIG. 9A, the power switch cell 25 includes first and second power switches 26, 27. In this example, the first power switch 26 has a lower driving capability than the second power switch 27.

The first power switch 26 has inverters 261 and 262 connected in series, and a P-type transistor 263. The first control signal CTR1 is given to a node INW, and is output from a node OUTW through the inverters 261 and 262. In the P-type transistor 263, a gate is connected to an intermediate node between the inverters 261 and 262, a source is connected to the node VDD, and a drain is connected to the node VVDD. When the first control signal CTR1 is at a high level, the potential of the intermediate node between the inverters 261, 262 is at a low level, and the P-type transistor 263 is turned on. On the other hand, when the first control signal CTR1 is at a low level, the potential of the intermediate node between the inverters 261, 262 is at a high level, and the P-type transistor 263 is turned off. More specifically, in the first power switch 26, conduction and cut-off between the node VDD and the node VVDD can be switched in accordance with the first control signal CTR1.

The second power switch 27 has inverters 271 and 272 that are connected in series, and a P-type transistor 273. The second control signal CTR2 is given to a node INS, and is output from a node OUTS through the inverters 271 and 272. In the P-type transistor 273, a gate is connected to an intermediate node between the inverters 271 and 272, a source is connected to the node VDD, and a drain is connected to the node VVDD. When the second control signal CTR2 is at a high level, potential of the intermediate node between the inverters 271 and 272 is at a low level, and the P-type transistor 273 is turned on. On the other hand, when the second control signal CTR2 is at a low level, potential of the intermediate node between the inverters 271 and 272 is at a high level, and the P-type transistor 273 is turned off. More specifically, in the second power switch 27, conduction and cut-off between the node VDD and the node VVDD can be switched in accordance with the second control signal CTR2.

As illustrated in FIG. 9B, the power switch cell 25 has the node VDD connected to the global power supply line 11, and the node VVDD connected to the local power supply line 8. Accordingly, the first power switch 26 is capable of performing switching between electrical connection and disconnection between the global power supply line 11 and the local power supply line 8 in accordance with the first control signal CTR1. The second power switch 27 is capable of performing switching between electrical connection and disconnection between the global power supply line 11 and the local power supply line 8 in accordance with the second control signal CTR2. In addition, the first power switches 26 are connected in a chain state so as to sequentially transmit the first control signal CTR1, and the second power switches 27 are connected in a chain state so as to sequentially transmit the second control signal CTR2.

Furthermore, in the present embodiment, the first and second power switches 26 and 27 are arranged in a power domain just like the power switch 21 of the first embodiment. More specifically, the first power switches 26 are connected in a chain state to form a first chain connection through which the first control signal CTR1 is sequentially transmitted. The first chain connection includes, for example, a structure in which multiple first power switches 26 sequentially transmitting the first control signal CTR1 are arranged in a spiral fashion. Furthermore, in the first chain connection, the starting point switch has a greater distance to the edges of a region occupied by the power domain than any ending point switch. In addition, the second power switches 27 are connected in a chain state to form a second chain connection through which the control signal CTR2 is sequentially transmitted. The second chain connection includes, for example, a structure in which multiple second power switches 27 sequentially transmitting the second control signal CTR2 are arranged in a spiral fashion. Furthermore, in the second chain connection, the starting point switch has a greater distance to the edges of a region occupied by the power domain than any ending point switch. Thus, just like in the first embodiment, at the time of resuming the power supply to the power domain, the influence of the power supply voltage drop on the surrounding of the power domain can be reduced.

In addition, the second control signal CTR2 is preferably given to the power domain later than the first control signal CTR1. In this configuration, the first power switch 26 having a low driving capability is turned on before the second power switch 27 having a high driving capability is turned on. Thus, when the first power switches 26 are sequentially turned on, the rush current is less likely generated due to the low driving capability. Moreover, since the second power switches 27 are sequentially turned on after the power voltage of the local power supply line has increased by the first power switches 26, the rush current is further less likely generated. Accordingly, the influence of the power supply voltage drop on the surrounding of the power domain can be further reduced.

The position of the starting point switch in the first chain connection may be the same as or different from that in the second chain connection. The position of the ending point switch in the first chain connection may be the same as or different from that in the second chain connection. The order of connection of the first power switches 26 in the first chain connection may be the same as or different from the order of connection of the second power switches 27 in the second chain connection.

Figure 10A:
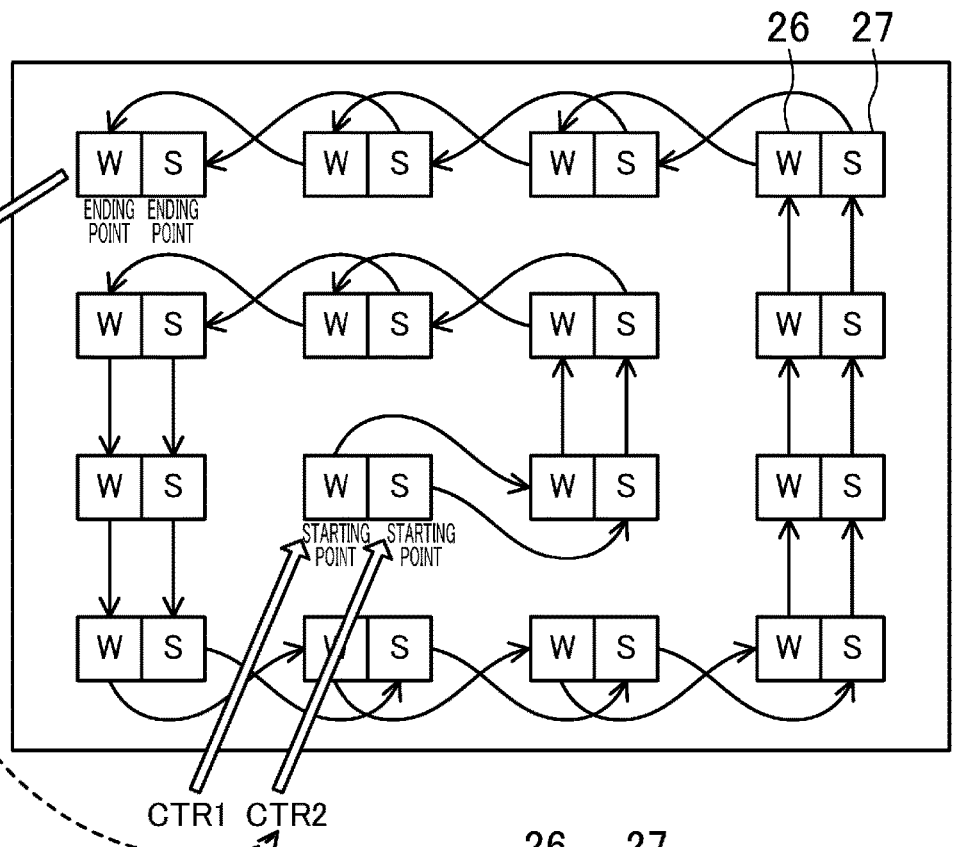
FIGS. 10A and 10B are conceptual diagrams illustrating examples of a chain connection of power switches according to a third embodiment.
Figure 10B:
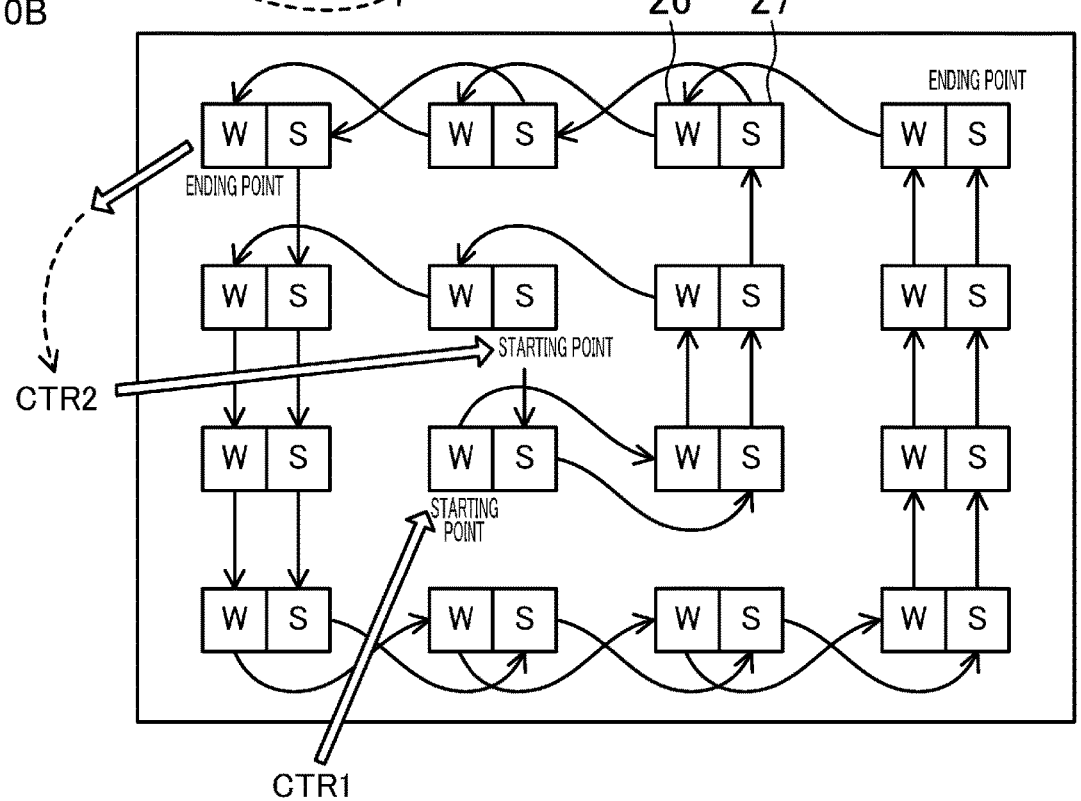

FIGS. 10A and 10B are conceptual diagrams illustrating examples of the connection state of the first and second power switches 26 and 27. In the example of FIG. 10A, the position of the starting point switch and the position of the ending point switch in the first chain connection are the same as those in the second chain connection. Furthermore, the order of connection of the first power switches 26 in the first chain connection is the same as the order of connection of the second power switches 27 in the second chain connection. The second control signal CTR2 is given to the power domain after the first control signal CTR1 is transmitted to the ending point switch.

In the example of FIG. 10B, the position of the starting point switch in the first chain connection is different from that in the second chain connection, and the position of the ending point switch in the first chain connection is also different from that in the second chain connection. Furthermore, the order of connection of the first power switches 26 in the first chain connection is different from the order of connection of the second power switches 27 in the second chain connection. The second control signal CTR2 is given to the power domain after the first control signal CTR1 is transmitted to the ending point switch.

In the same manner as the configuration according to the first embodiment illustrated in FIG. 6, the first chain connection of the first power switches 26 and the second chain connection of the second power switches 27 may be divided into a plurality of portions. In this case, the order of electrical connection of the first power switch 26 to the global power supply line 11 and the local power supply line 8, and the order of electrical connection of the second power switch 27 to the global power supply line 11 and the local power supply line 8 may be the same or different.

Fourth Embodiment

In the same manner as in the above-described embodiment, if the starting point switch is arranged distant from the edges of the power domain or the edges of the region from which the macro block is excluded, the wiring length of a signal line propagating the control signal from the outside of the power domain to the starting point switch becomes long. This may result in a long delay of the control signal. In the present embodiment, in order to reduce the delay of the control signal, the control signal is relayed by other power switches or buffers through the signal line from the outside of the power domain to the starting point switch.

Figure 11B:
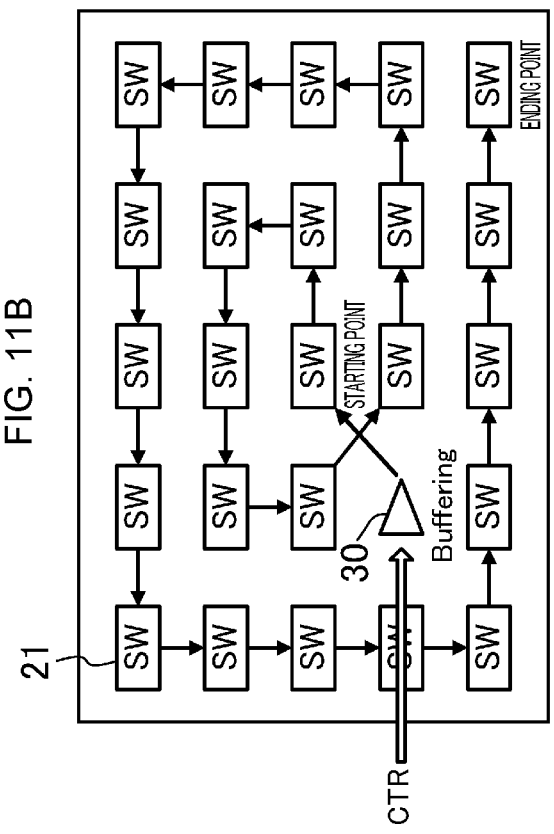
FIGS. 11A to 11C are conceptual diagrams illustrating examples of a chain connection of power switches according to a fourth embodiment.
Figure 11A:
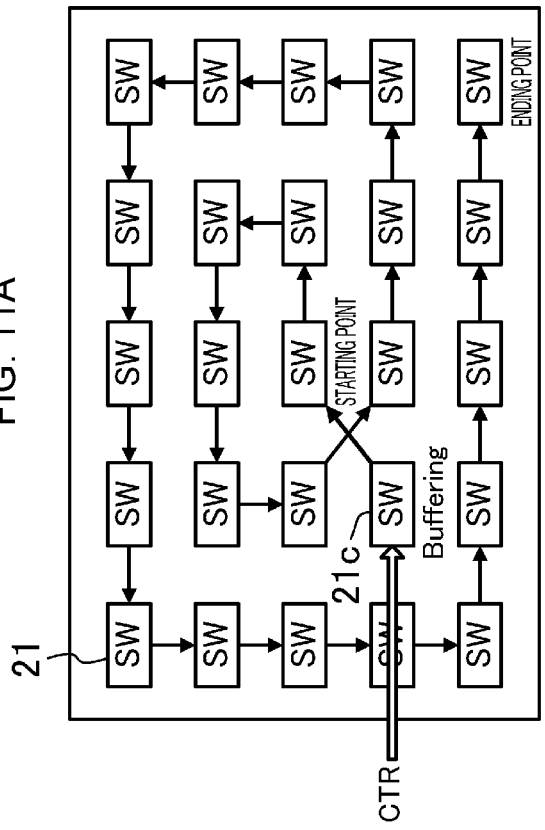
Figure 11C:
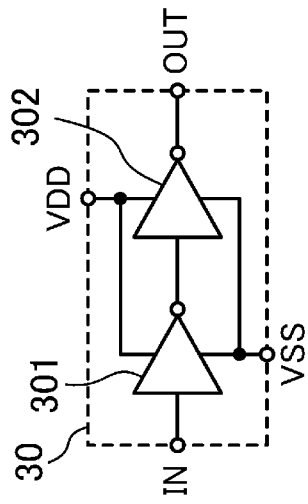

FIGS. 11A to 11C are conceptual diagrams illustrating examples of the chain connection of the power switches according to the fourth embodiment. In the example of FIG. 11A, the control signal CTR propagating to the starting point switch in a signal path is relayed by another power switch 21c. In this case, it can be regarded that the power switch 21c is actually the starting point of the chain connection. In the example of FIG. 11B, an always-on-buffer (AOB) 30, which is an exemplary buffer circuit, relays the control signal CTR in the signal path propagating the control signal CTR to the starting point switch. FIG. 11C is a circuit configuration example of the AOB 30. In FIG. 11C, the AOB 30 comprises inverters 301 and 302 connected in series.

FIG. 12 shows a configuration example of the chain connection of the power switches corresponding to the example of FIG. 11A. In the configuration example of FIG. 12, the power switch 21c is arranged between the starting point switch 21a and the lower side of the power domain in the drawing. Among the domain edges BE, one corresponding to the lower side of the power domain in the drawing is the closest to the power switch 21c. Thus, a distance D3 in FIG. 12 is the distance to the domain edge BE. As is clear from FIG. 12, the following formula is met.

$$D1 > D3 > D2$$

Since the power switch 21c is actually the starting point of the chain connection, the starting point switch 21a as the first switch has a greater distance to the domain edge BE than the power switch 21c as the starting point switch. In addition, the power switch 21c has a greater distance to the domain edge BE than the ending point switch 21b.

FIG. 13 is a configuration example of the chain connection of the power switches corresponding to the example of FIG. 11B. In the configuration example of FIG. 13, the AOB 30 is arranged between the starting point switch 21a and the lower side of the power domain in the drawing. However, since the AOB 30 is not connected to the local power supply line 8 (VVDD), there is no influence on the surrounding, and thus the arrangement position of the AOB 30 has no restriction.

As described above, the present embodiment can reduce the delay of the control signal CTR given from the outside of the power domain to the chain connection of the power switches.

Note that the configuration of the switch cells 20 illustrated in FIGS. 3A and 3C, and the configuration of the switch cells 25 illustrated in FIGS. 9A and 9B are merely examples. It is sufficient that the switch cell 20 comprises a power switch that is capable of performing switching between electrical connection and disconnection between the local power supply line 8 and the global power supply line 11 in accordance with a control signal. For example, in FIG. 3A, buffers may be used instead of the inverters 211, 212. In this case, relationship between the logic of the control signal and connection/disconnection is reversed. The switch cells 20 and 25 are double-height cells, which may be replaced with single-height cells, for example.

In the present disclosure, at the time of resuming power supply to a power domain to which power supply has been shut-off, rush current flowing into the power domain can be reduced and the influence on the surrounding power domains is avoided, in a semiconductor integrated circuit device using a power gating technique. Thus, the present disclosure is effective for improvement in performance of an LSI, for example.

What is claimed is:

1. A semiconductor integrated circuit device, comprising:
a global power supply line; and
a power domain,
the power domain including:
   a local power supply line;
   a plurality of standard cells connected to the local power supply line; and
   a plurality of power switch cells,
wherein each of the plurality of power switch cells includes a power switch capable of performing switching between electrical connection and disconnection between the global power supply line and the local power supply line in accordance with a control signal,
the power switches of the plurality of power switch cells are connected in a chain state to form a chain connection through which the control signal is sequentially transmitted, the power switches including a starting point switch which is positioned at the beginning of the chain connection and to which the control signal is given from outside of the power domain, and at least one ending point switch positioned at the end of the chain connection, and
a distance between the starting point switch and a first edge of a region occupied by the power domain is greater than a distance between the at least one ending point switch and a second edge of the region occupied by the power domain, wherein the first edge is the nearest to the starting point switch among edges of the region occupied by the power domain and the second edge is the nearest to the at least one ending point switch among edges of the region occupied by the power domain.

2. The semiconductor integrated circuit device of claim 1, wherein the chain connection has a structure in which the power switches sequentially transmitting the control signal are arranged in a spiral fashion.

3. The semiconductor integrated circuit device of claim 1, wherein the chain connection has a branched structure in which the control signal is branched and transmitted from one of the power switches to other power switches.

4. The semiconductor integrated circuit device of claim 1, wherein
the power switches include a first switch that receives the control signal from the starting point switch, and
a distance between the first switch and a third edge of the region occupied by the power domain is greater than the distance between the starting point switch and the first edge of the region occupied by the power domain, wherein the third edge is the nearest to the first switch among edges of the region occupied by the power domain.

5. The semiconductor integrated circuit device of claim 1, wherein the power domain includes a buffer circuit that is inserted into a signal line transmitting the control signal given from the outside of the power domain to the starting point switch.

6. The semiconductor integrated circuit device of claim 1, wherein
the power domain includes a macro block, and
a region of the power domain excluding the macro block is regarded as the region occupied by the power domain.

7. The semiconductor integrated circuit device of claim 1, wherein
each of the plurality of power switch cells further includes:
   a second power switch capable of performing switching between electrical connection and disconnection between the global power supply line and the local power supply line in accordance with a second control signal,
the second power switches of the plurality of power switch cells are connected in a chain state to form a second chain connection through which the second control signal is sequentially transmitted, the second power switches including a second starting point switch which is positioned at the beginning of the second chain connection and to which the second control signal is given from the outside of the power domain, and at least one second ending point switch which is positioned at the end of the second chain connection, and
a distance between the second starting point switch and a fourth edge of the region occupied by the power domain is greater than a distance between the at least one second ending point switch and a fifth edge of the region occupied by the power domain, wherein the fourth edge is the nearest to the second starting point switch among edges of the region occupied by the power domain and the fifth edge is the nearest to the at least one second ending point switch among edges of the region occupied by the power domain.

8. The semiconductor integrated circuit device of claim 7, wherein the starting point switch and the second starting point switch are contained in a same power switch cell of the power switch cells, and the ending point switch and the second ending point switch are contained in a same power switch cell of the power switch cells.

9. The semiconductor integrated circuit device of claim 7, wherein an order of connection of the power switches in the chain connection is the same as an order of connection of the second power switches in the second chain connection.

10. The semiconductor integrated circuit device of claim 7, wherein the power switches have a lower driving capability than the second power switches, and the second control signal is given to the power domain later than the control signal.

11. The semiconductor integrated circuit device of claim 10, wherein the second control signal is given to the power domain after the control signal is transmitted to the ending point switch.

12. A semiconductor integrated circuit device comprising:
a global power supply line; and
a power domain,
the power domain including:
a local power supply line;
a plurality of standard cells connected to the local power supply line; and
a plurality of power switch cells, wherein
each of the plurality of power switch cells includes a power switch capable of performing switching between electrical connection and disconnection between the global power supply line and the local power supply line in accordance with a control signal,
the power switches of the plurality of power switch cells are configured such that the control signal electrically and sequentially connects the global power supply line and the local power supply line, the power switches including a starting point switch which firstly establishes electrical connection between the global power supply line and the local power supply line, and at least one ending point switch which lastly establishes electrical connection between the global power supply line and the local power supply line, and
a distance between the starting point switch and a first edge of a region occupied by the power domain is greater than a distance between the at least one ending point switch and a second edge of the region occupied by the power domain, wherein the first edge is the nearest to the starting point switch among edges of the region occupied by the power domain and the second edge is the nearest to the at least one ending point switch among edges of the region occupied by the power domain.

13. The semiconductor integrated circuit device of claim 12, wherein a structure is provided in which the power switches sequentially transmitting the control signal are arranged in a spiral fashion.

14. The semiconductor integrated circuit device of claim 12, wherein a branched structure is provided in which the control signal is branched and transmitted from one of the power switches to the other power switches.

15. The semiconductor integrated circuit device of claim 12, wherein
the power switches include a first switch that receives the control signal from the starting point switch, and
a distance between the first switch and a third edge of the region occupied by the power domain is greater than the distance between the starting point switch and the first edge of the region occupied by the power domain, wherein the third edge is the nearest to the first switch among edges of the region occupied by the power domain.

16. The semiconductor integrated circuit device of claim 12, wherein
the power domain includes a macro block, and
a region of the power domain excluding the macro block is regarded as the region occupied by the power domain.

17. The semiconductor integrated circuit device of claim 12, wherein
each of the plurality of power switch cells further includes:
a second power switch capable of performing switching between electrical connection and disconnection between the global power supply line and the local power supply line in accordance with a second control signal,
the second power switches of the plurality of power switch cells are configured such that the second control signal electrically and sequentially connects the global power supply line and the local power supply line, the power switches including a second starting point switch which firstly establishes electrical connection between the global power supply line and the local power supply line, and at least one second ending point switch which lastly establishes electrical connection between the global power supply line and the local power supply line, and
a distance between the second starting point switch and a fourth edge of the region occupied by the power domain is greater than a distance between the at least one second ending point switch and a fifth edge of the region occupied by the power domain, wherein the fourth edge is the nearest to the second starting point switch among edges of the region occupied by the power domain and the fifth edge is the nearest to the at least one second ending point switch among edges of the region occupied by the power domain.

18. The semiconductor integrated circuit device of claim 17, wherein
the starting point switch and the second starting point switch are contained in a same power switch cell of the power switch cells, and
the ending point switch and the second ending point switch are contained in a same power switch cell of the power switch cells.

19. The semiconductor integrated circuit device of claim 17, wherein an order of electrical connection of the global power supply line and the local power supply line by the power switches is the same as an order of electrical connection of the global power supply line and the local power supply line by the second power switches.

20. The semiconductor integrated circuit device of claim 17, wherein
the power switches have a lower driving capability than the second power switches, and
the second control signal is given to the power domain later than the control signal.

* * * * *